United States Patent [19]

Frankeny et al.

[11] Patent Number: 5,279,711
[45] Date of Patent: Jan. 18, 1994

[54] CHIP ATTACH AND SEALING METHOD

[75] Inventors: Jerome A. Frankeny, Taylor; Richard F. Frankeny; Joseph LaTorre, both of Austin, all of Tex.

[73] Assignee: International Business Machines Corporation, Armonk, N.Y.

[21] Appl. No.: 724,246

[22] Filed: Jul. 1, 1991

[51] Int. Cl.$^5$ .............................................. H05K 1/00
[52] U.S. Cl. ................................... 174/263; 174/260; 439/483; 228/180.1; 228/180.2; 361/774; 361/784
[58] Field of Search ............... 174/260, 262, 263, 264, 174/88 R, 259; 361/400, 403, 406, 412, 414; 439/483; 257/80; 228/180.1, 180.2

[56] References Cited

U.S. PATENT DOCUMENTS

| | | | |
|---|---|---|---|
| 3,606,677 | 9/1971 | Ryan | 29/627 |
| 3,670,396 | 6/1972 | Lindberg | 29/471.3 |
| 4,074,342 | 2/1978 | Honn et al. | 361/411 |
| 4,208,005 | 6/1980 | Nate et al. | 228/175 |
| 4,216,350 | 8/1980 | Reid | 174/259 |
| 4,604,644 | 8/1986 | Beckham et al. | 357/80 |
| 4,617,730 | 10/1986 | Geldermans et al. | 29/843 |
| 4,818,728 | 4/1989 | Rai et al. | 357/80 X |
| 4,940,181 | 7/1990 | Juskey, Jr. et al. | 228/180.2 |
| 4,967,313 | 10/1990 | Berner | 361/406 X |
| 4,967,314 | 10/1990 | Higgins, III | 361/414 |
| 4,975,079 | 12/1990 | Beaman et al. | 439/482 |
| 5,041,183 | 8/1991 | Nakamura et al. | 174/88 R X |
| 5,056,216 | 10/1991 | Madou et al. | 174/263 X |
| 5,075,965 | 12/1991 | Carey et al. | 228/180.2 X |

FOREIGN PATENT DOCUMENTS

| | | | |
|---|---|---|---|
| 56-148840 | 11/1981 | Japan | 228/180.2 |
| 1-241776 | 9/1989 | Japan | 228/180.1 |
| 2212333 | 7/1989 | United Kingdom | H05K 3/46 |

OTHER PUBLICATIONS

Hawley, Gessner, "The Condensed Chemical Dictionary", eighth edition, 1966, p. 17.
IBM TDB "Replaceable Chip to Heat Sink Connection on Circuit Boards", vol. 14, No. 11, Apr. 1972, p. 3332.
IBM TDB "Protective Coating Between Chip and Substrate", vol. 18, No. 12, May 1976, p. 4191.
IBM TDB "Pin Support for IC Chip to Prevent C4 Collapse During Reflow", vol. 30, No. 11, Apr. 1988, pp. 320-321.
IBM TDB "Multilayer Module", vol. 20, No. 12, May 1978, pp. 5172-5174.
IBM TDB "Chip Protective Coating", vol. 23, No. 5, Oct. 1980, pp. 1877-1878.
IBM TDB "Thin-Film Modules with Matched Thermal Expansion", vol. 29, No. 4, Sep. 1986 pp. 1762-1763.
Research Disclosure "Selective Connection of Circuit Elements in Multilayer Ceramic Structure", No. 306, Oct. 1989.
IBM TDB "Encapsulated Solder Joint for Chip Mounting", vol. 32, No. 10B, Mar. 1990, p. 480.

*Primary Examiner*—Leo P. Picard
*Assistant Examiner*—Cheryl R. Figlin
*Attorney, Agent, or Firm*—Mark E. McBurney

[57] ABSTRACT

A method of fabricating a substrate module is provided that includes cavities of a diameter and depth which take into account the statistical variance in the dimensions of C4 solder balls. By constructing cavities with the proper dimensions, electrical connection between the chip and substrate, via the solder balls, can be ensured. Further, an annular shoulder is provided which acts as a positive stop to prevent any over travel of the C4s within the cavity, thereby allowing a great deal more pressure to be applied to seat the chip than possible with conventional methods. The present invention also provides processes for applying a coating of material onto the substrate which acts as an adhesive and sealant. This material is provided intermediate any of the holes or cavities (vias) which may be contained within the substrate, and is not deposited in these vias such that no interference is encountered when attaching the chip by way of the C4 solder balls thereon. Chips, or additional substrate layers are then placed onto the substrate, thereby forming a sealed integrated circuit module, which has adhesive between the chip and carrier layers.

18 Claims, 6 Drawing Sheets

CHIP ATTACH AND SEALING METHOD

BACKGROUND OF THE INVENTION

1. Field of the Invention

The present invention generally relates to methods of directly attaching an integrated circuit (IC) device, or chip to a substrate to form a module and sealing the chip such that external materials are prevented from contaminating the IC. More particularly, a substrate is fabricated having cavities, or the like with particular dimensions such that a controlled collapse chip connect (C4) type chip can be attached and directly contact the substrate. Further, a sealing material is applied to a the substrate prior to attachment of the C4 type chip thereby providing a continuous layer of sealant material between the chip and substrate. Additionally, the present invention can be used for layer to layer attachment of substrates in fabricating a multilayer carrier, or any other application requiring the selective coating of material onto a surface.

2. Description of Related Art

Chip attach methods using C4 solder ball technology are well known in the art. Using conventional techniques, chips with C4 solder balls are aligned with a relief area (dimple, cavity, or the like) or connection pad on a substrate and pressed into place. Prior art methods maintain a defined space between the chip and the substrate, as shown by U.S. Pat. Nos. 4,940,181: 4,074,342; 4,617,730. Because of this intermediate spacing, the amount of pressure that can be applied to seat the chip onto the substrate is severely limited. It can be seen that the solder balls will be crushed, or the chip damaged when even a small amount of force exceeding the placement force is applied to the chip.

Solder balls are not exactly uniform and their dimensions may vary, from the desired 0.006 inches (6 mils), on the order of $+/-0.3$ mils. Thus, it can be seen that when a chip is placed onto a substrate connection pad not all of the solder balls will contact the pad i.e. some of the smaller C4s will be suspended above the contact pads. Further, conventional methods and configurations only allow limited pressure to be applied to the chip to seat it onto the substrate in order to make the required electrical connections therebetween. Of course, the solder balls could be reflowed, but this would create a permanent electrical connection and cause a great deal more time and effort to be used to rework the substrate, by removing any chips that test bad.

Conventional techniques for sealing chips attached to substrates include injecting sealant material around the periphery of the chip/substrate interface or completely coating the chip and substrate assembly with sealing material, as well as allowing sealant to flow between the substrate and chip, around the solder balls. Injecting sealant around the periphery does not provide a continuous layer of sealing material and leaves some C4 joints exposed under the chip. Coating the assembly prevents any type of rework of the substrate if, for example, one of the ICs on a substrate proves to be defective, i.e. the entire assembly will have to replaced, as opposed to a single chip. Flowing sealant between the chip and substrate necessarily requires that the chip not be placed directly adjacent the substrate, as contemplated by the present invention.

IBM TDB, "Encapsulated Solder Joint for Chip Mounting" shows a chip bonded to a substrate and sealing resin subsequently applied to the gap between the chip and the substrate. IBM TDB, "Chip Protective Coating" describes coating a chip, including solder balls, with a polyimide layer. The material is then shaved to expose the solder and the polyimide remains intermediate the solder. The polyimide layer is used to protect the chip from alpha particle absorption from the substrate. IBM TDB, "Replaceable Chip to Heat Sink Connection on Circuit Boards" uses a thermoplastic layer intermediate a chip and heat sink to compensate for differences in thermal expansion.

U.S. Pat. No. 4,604,644 shows a chip and substrate assembly with a dielectric material disposed intermediate therebetween, but only around the periphery of the chip.

Further, prior art methods do not provide any means of temporarily bonding the chip to the substrate to help compensate for the expansions and contractions of the chip with respect to the substrate, or vice versa, that occur due to differences in thermal coefficients of expansion.

It can be seen that none of the prior art methods provide a method or configuration which allow a chip to be placed in direct abutting relation with the substrate such that a sufficient amount of pressure can be applied to the chip, to ensure proper electrical connection between the chip and substrate without reflowing the C4 solder balls. Further, conventional methods do not describe placing a continuous layer of sealing material between a substrate and chip, being attached thereto, which will prevent contaminants from entering the chip and corrupting its performance. Also, prior art methods do not show providing such a sealing layer that also exhibits adhesive qualities and compensates for differences in the coefficients of thermal expansion between the chip and substrate, thereby facilitating the chip attach process.

Thus, it would be desirable to have a method and configuration which allows sufficient pressure to be applied to a chip in order to electrically connect each input/output connection point with the corresponding I/Os on the substrate, without crushing the solder balls or damaging the chip. Further, it would be advantageous to be able to apply an adhesive and sealant between the chip and substrate, to provide compensation for thermal expansion differences and seal the chip from exterior contaminants.

SUMMARY OF THE INVENTION

In contrast to the prior art, the present invention provides economical and reliable methods for attaching a chip to a substrate, or carrier and applying a continuous layer of sealing material intermediate the chip and substrate, thereby forming an integrated circuit module. Broadly, a method of fabricating a substrate is provided that includes cavities of a diameter and depth which take into account the statistical variance in the dimensions of C4 solder balls. By constructing cavities with the proper dimensions, electrical connection between the chip and substrate, via the solder balls, can be ensured. Further, an annular shoulder is provided which acts as a positive stop to prevent any over travel of the C4s within the cavity, thereby allowing a great deal more pressure to be applied to seat the chip than possible with conventional methods.

The method of fabricating the substrate of the present invention includes providing a substrate having at least one electrically conductive stud formed therein, in electrical contact with a corresponding C4 connection pad. A dielectric layer is then applied to the substrate and cavities, corresponding to C4 solder ball locations on the chip, and having related annular shoulders are formed therein by photoimaging, or the like.

Next, the present invention provides processes for applying a coating of material onto the substrate which acts as an adhesive and sealant. This material is provided on the substrate surface intermediate any of the holes or cavities (vias) which may be contained within the substrate, and is not deposited in these vias such that interference is avoided when attaching the chip by way of the C4 solder balls thereon.

Methods of applying the layer of sealing material to the substrate include offset printing techniques using a master template, having projections with dimensions such that sealant/adhesive is applied on the substrate surface while bridging the cavities where the material must not be applied. The material is applied on the substrate where cavities are not located. The master template is disposed around the outside periphery of a roller and the sealant/adhesive material is applied thereto. It can be seen that portions of the sealant will only be disposed on the master at the projections and when the roller is applied to the substrate, sealant on the roller projections will be deposited on the substrate at locations, which are not recessed.

Sealing material can also be applied to the substrate surface by first placing liquid, or the like in the cavities in the substrate. Next, a roller having the sealant/adhesive material thereon is rolled over the substrate, thereby depositing the material continuously over the substrate except at the cavities containing the liquid. In this manner a contiguous sheet of sealing material, having holes corresponding to the cavities in the substrate surface, is placed on the substrate. The sealant/adhesive material may also be applied by other liquid application techniques, including roller coating, slot coating, curtain coating, spray coating, or the like.

Since the cavities correspond to C4 locations on the chip to be attached, the chip is then placed adjacent the substrate and pressed into place. The C4 solder balls enter the cavities a sufficient distance to ensure proper electrical contact since the depth and diameter of the cavities take into account the statistical variance of the C4 solder balls. The underside of the chip and the top side of the substrate will abut one another with the sealing layer intermediate therebetween. The sealant also is used as an adhesive and testing of the substrate can now occur and the chip can be removed for rework of the substrate if defective chips are found. Subsequent to successful testing, reflow of the solder can be implemented and the sealed substrate/chip assembly is complete.

In accordance with the previous summary, objects features and advantages of the present invention will become apparent to one skilled in the art from the subsequent description and the appended claims taken in conjunction with the accompanying drawings.

DETAILED DESCRIPTION OF THE PREFERRED EMBODIMENTS

Figure 1:
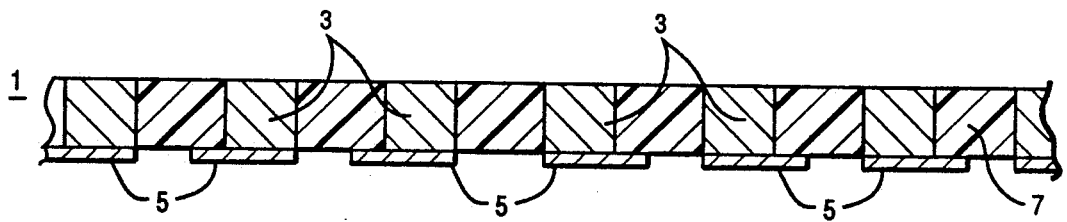
FIG. 1 is a crossectional view of a substrate having C4 connection pads and conductive studs formed therein.
Figure 12:
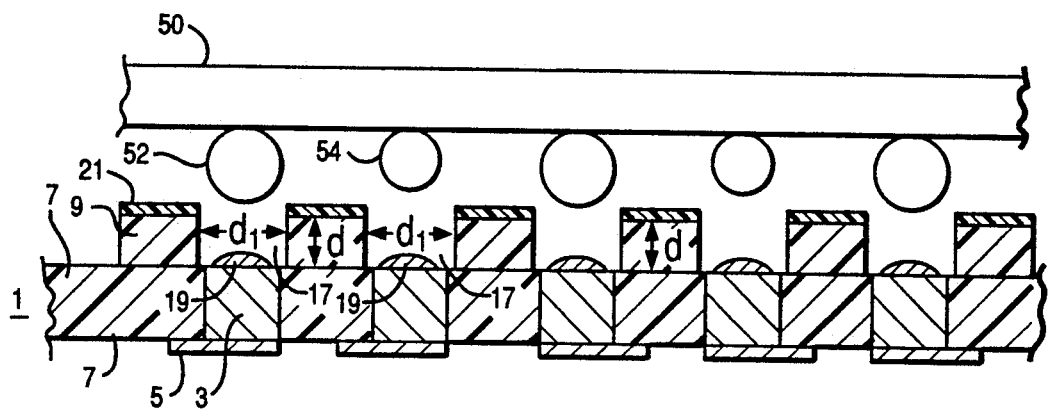
FIG. 12 is a crossectional view of the substrate of the present invention and an integrated circuit device to be placed thereon.
Figure 13:
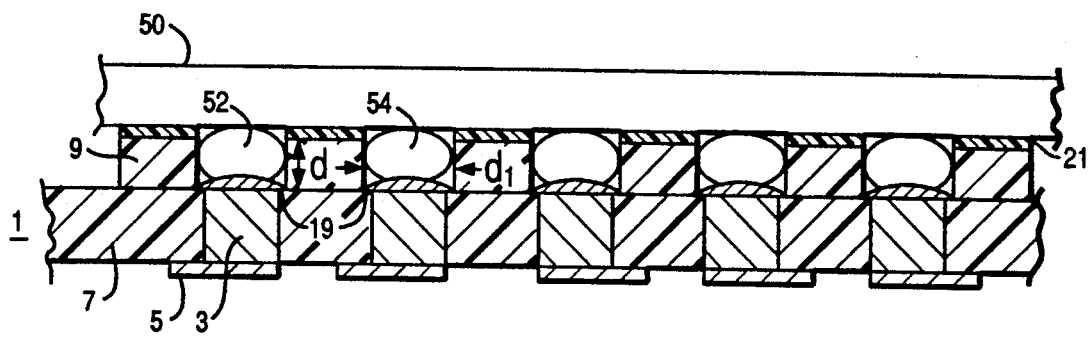
FIG. 13 is another crossectional view of the substrate and chip in abutting relation with one another.

Referring to FIG. 1, a crossectional view of a substrate is shown, as noted by reference numeral 1. A dielectric material 7, such as polyimide is used which has plural conductive studs 3 therethrough which are in electrical communication with the substrate wiring 5. This type of substrate is currently used in processes such as tape automated bonding (TAB) with the C4 solder balls of integrated circuit device 50 (FIGS. 12 and 13). It should be noted that substrate wiring 5 is representative of wiring, such as signal lines, that allows electrical interconnection of a chip, or additional substrate layer (FIGS. 17 and 18) with the substrate shown in FIG. 1.

The process by which the present invention is fabricated will now be described beginning with FIG. 2. Reference numeral 1 will continue to be used to generally denote the substrate of the present invention, even though modifications will be made thereto. A photo imaginable dielectric material 9 is applied as a layer on top of substrate 1. This dielectric material may be any one of a number of commercially available dielectrics of proper resolving characteristics. Further, layer 9 is applied to substrate 1 by any number of techniques such as curtain coating, slot coating, roller coating, spray coating, electrode depositing, dry film lamination or the like. Layer 9 is applied such that depth, or thickness is controllable and a uniform depth d of dielectric material is place on substrate 1. The importance of the dimension d will be discussed in detail below.

Figure 2:
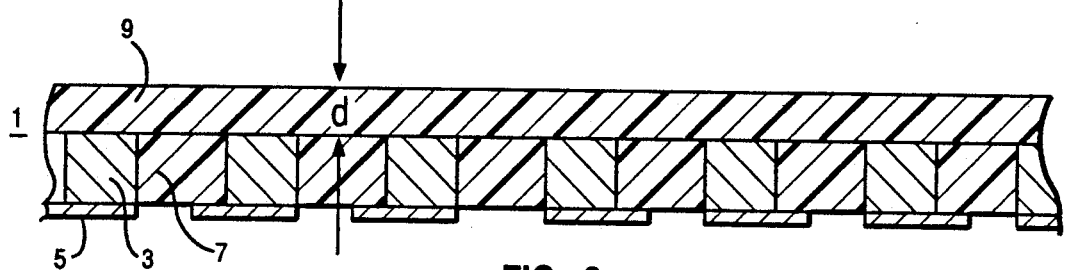
FIG. 2 is another crossectional view of the substrate of FIG. 1 with a layer of dielectric material applied to the surface thereof.
Figure 3:
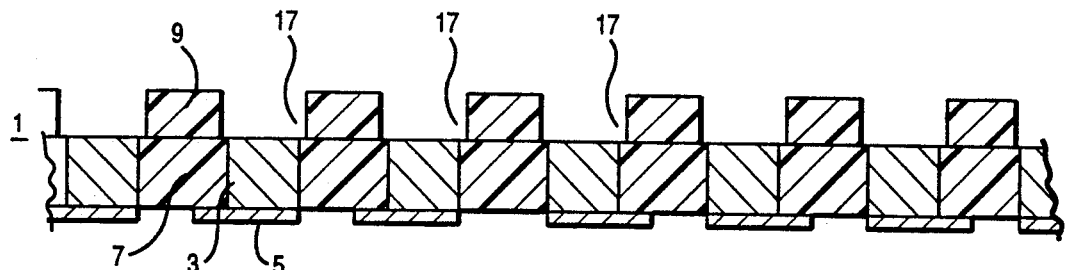
FIG. 3 is a crossectional view of the substrate after portions of the dielectric material adjacent the conductive studs had been removed to form cavities.

FIG. 3 is a crossectional view of the substrate of the present invention in which cavities 17 have been formed in the dielectric layer 9 of FIG. 2. One method for producing the cavities is by using a photoimageable dielectric material for layer 9. By utilizing the proper artwork, and exposing and developing the material according to the dictated process for the particular dielectric material chosen, the desired cavity dimensions d1 and D are produced.

Figure 4:
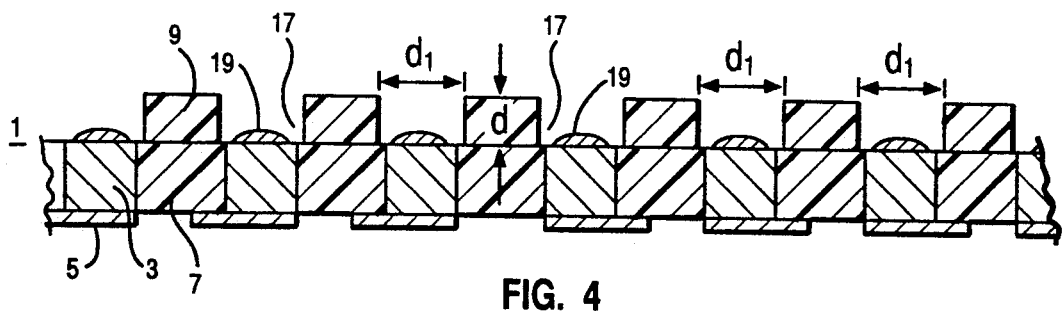
FIG. 4 shows the substrate of FIG. 3 after joining metallurgy has been applied to the conductive studs.

FIG. 4 shows the crossection of the substrate of the present invention after application, or plating joining metallurgy 19, such as solder, or the like applied to the substrate at the bottom of cavity 17. This joining metallurgy, is in electrical communication with conductive studs 3. Further, the diameter of cavities 17 is shown by reference d1. The importance of this dimension will be described in detail below in conjunction with depth d. Diameter d1 is accurately controllable with the process of the present invention since the feature size of the mask used in the photoimaging process can be controlled to a great degree of accuracy.

Continuing with the process of fabricating the chip/-substrate module, or multilayer substrate of the present invention, it is desirable to apply a thin layer of joining material such as a thermoplastic type adhesive to the top of dielectric 9 to act as a sealant and bonding agent. It should be noted that different types of sealant/adhesive may be used depending on the application. For example, a joining material may be a thermoplastic material (the solid or liquid state of the material is temperature dependent) will be used for attaching chips, since it may be desirable to rework the module subsequent to seating the chip. However, for multilayer modules a thermoset joining material (once the components of the material are crosslinked a permanent bond is formed that is temperature independent) will be used in order to form a permanent bond between the individual layers of the module. A thermoset material is preferred for layer to layer bonding since during any rework operations, it is desired to remove only the chips attached to the multilayer module and not disassemble the layers of the module. Of course, those skilled in the art will understand that a thermoplastic material can be used for layer to layer bonding if it has a higher glass transition temperature than the thermoplastic material used for attaching chips. As stated previously, prior art methods of providing sealing between the chip and substrate, included injecting sealant intermediate the chip and substrate after placement of the chip thereon. In contrast, the present invention provides a thin thermoplastic or thermoset layer 21 (FIG. 7) to the top of dielectric 9 prior to the attachment of the chip or additional substrate layer, thereby providing a more uniform and consistent application of sealing material than is possible with prior art methods. Further, as will be later described, sealing material 21 also acts as an adhesive which provides support between the chip and substrate to compensate for the differences in thermal coefficients of expansion between the chip and substrate.

Figure 5:
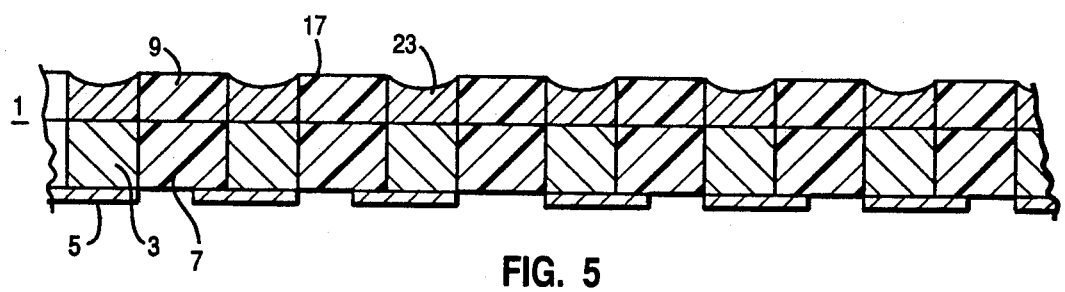
FIG. 5 shows the substrate with the cavities filled with an aqueous solution.
Figure 6:
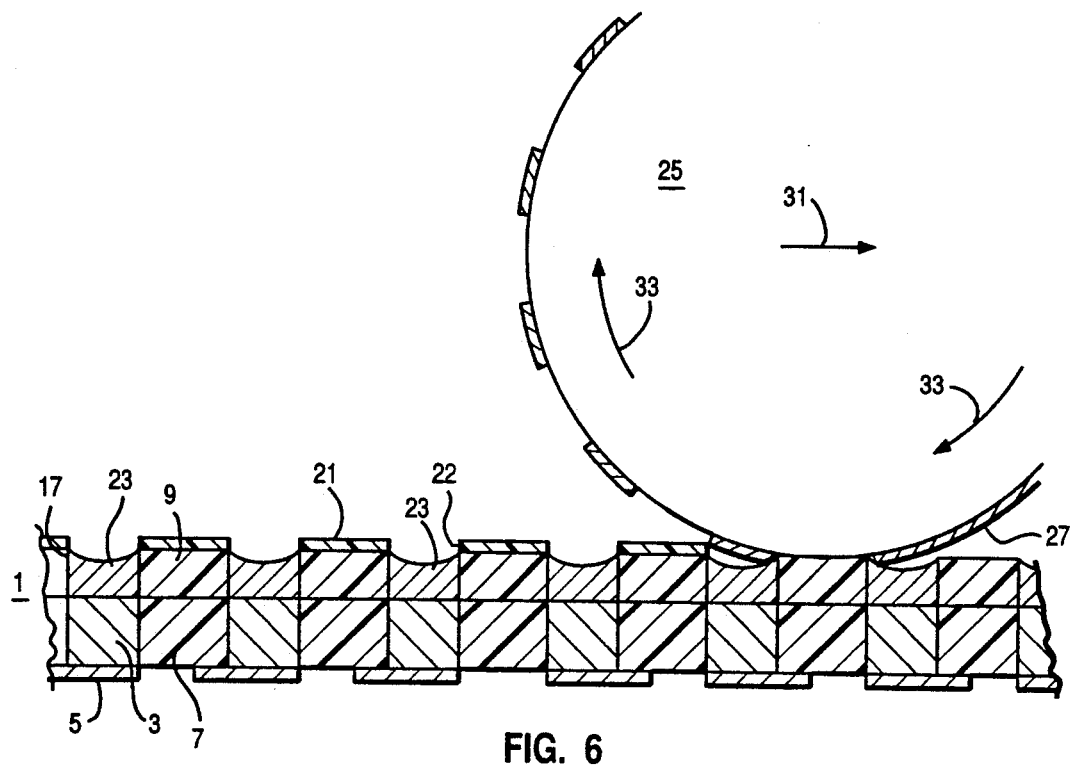
FIG. 6 illustrates a first preferred embodiment of applying a sealing and adhesive material to the substrate.

A first preferred embodiment of the method to apply the sealant/adhesive layer 21 onto dielectric layer 9 will be described with reference to FIGS. 5 and 6. FIG. 5 shows a substrate identical to substrate 1 of FIG. 4, but having a liquid solution 23, such as water, ethylene glycol, or the like, contained within cavity 17. This liquid solution 23 can be sprayed, or otherwise placed into cavities 17, e.g. by immersing the substrate in the liquid to be placed in the cavities and then removing the liquid from the surface by evacuating or applying ultrasonic energy to the substrate, as well as blowing, squeegeeing, or the like. Referring to FIG. 6, one method of actually applying a continuous layer 21 onto dielectric 9 is shown. A roller 25 is provided with a thin continuous sealant/adhesive layer of thermoplastic or thermoset material 27 thereon. Layer 27 can be placed around the circumference by a number of conventional techniques such as moving the roller 25, over a specified amount of joining material disposed on a flat surface, or spraying the material onto roller 25 or the like. The roller 25 is then continuously rolled over the substrate shown in FIG. 6, with the solution 23 disposed in cavities 17. The motion of the roller 25 in FIG. 6 is shown by an arrow noted with reference numeral 31. Similarly, the motion of the outer surface of roller 25, with respect to the top surface of dielectric layer 9, is shown by arrows 33. Therefore, it can be seen that as roller 25 moves from left to right across the top of dielectric 9, material 27 is disposed continuously along top surface 9 except where the solution 23 contained in cavities 17 is encountered. It will be understood by those skilled in the art, that the thermoplastic or thermoset layer 27 will only adhere to the dielectric 9, due to the non-wetting properties of solution 23 with respect to the joining material, therefore no sealant/adhesive will be placed at any point where solution 23 is encountered. Consequently, a continuous layer 21, having defined holes 22, precisely corresponding to the diameter of cavities 17, is placed along the top surface of dielectric 9. Further, it can be seen that the portions of continuous layer 27 corresponding to cavities 17 will remain adhered to roller 25 as it moves across the surface of dielectric 9, as shown in FIG. 6 by reference numeral 29. Subsequent to the placement of layer 21 along dielectric 9, solution 23 is then removed from cavities 17 by drying, rinsing or other means known in the art.

Figure 14:
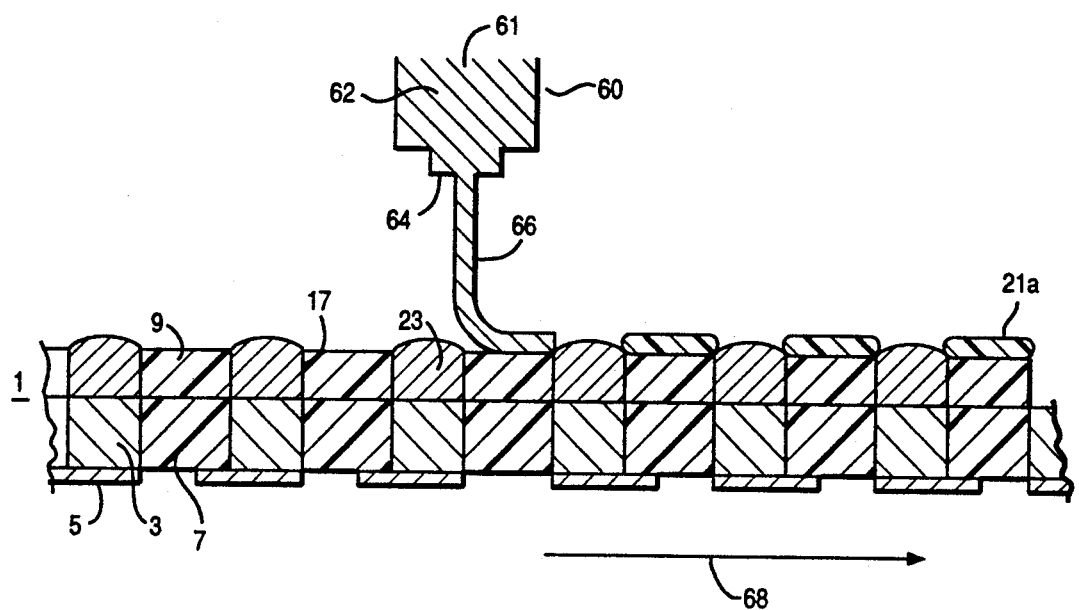
FIG. 14 illustrates another preferred embodiment of applying the sealant/adhesive material to the substrate of FIG. 5.

Other preferred embodiments of the present invention include using spray coating, roller coating, curtain coating, slot coating, or the like to apply the thermoplastic/thermoset layer 21 to the substrate shown in FIG. 5. For example. FIG. 14 shows layer 21a being applied by curtain coating methods. Curtain coating apparatus 60 contains the appropriate type of material 61 (thermoplastic or thermoset) in a reservoir 62. The material 61 is then fed through a substantially rectangular slot 64 which creates a continuously downwardly moving sheet of material 61. Substrate 1 is then moved perpendicularly with respect to the downwardly moving material 61 in the direction as shown by arrow 68. In this manner a continuous layer 21a of adhesive/sealant material is placed upon the surface of layer 9 everywhere except the cavities 17 containing solution 23, as described above.

Figure 15:
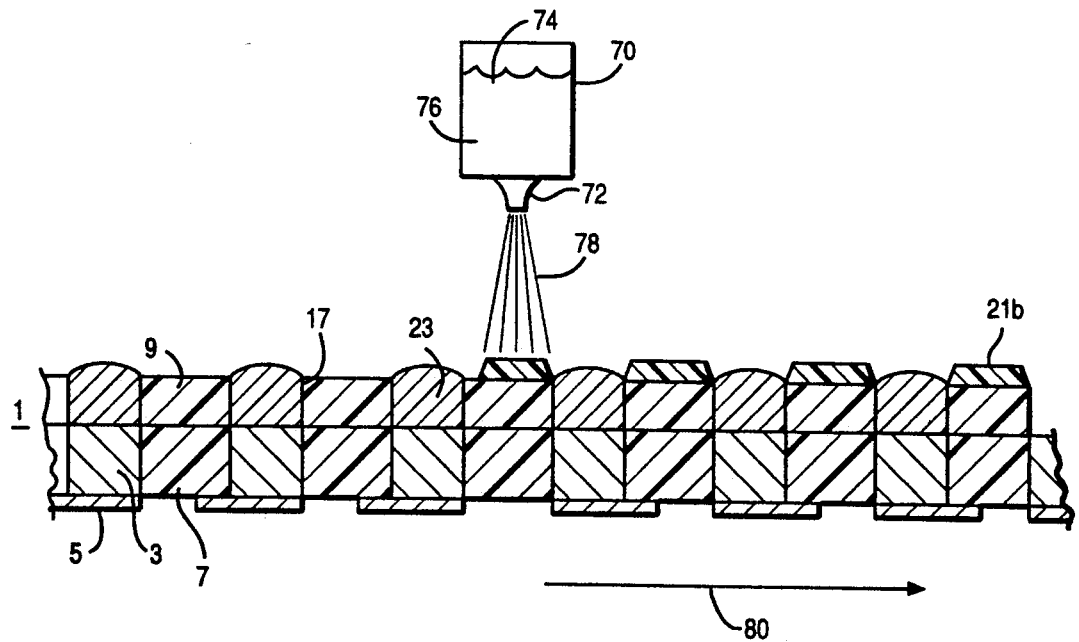
FIG. 15 is yet another preferred embodiment of the application of the sealant/adhesive material to the substrate of FIG. 5.

FIG. 15 shows a spray coating method wherein a layer 21b is applied to the surface of layer 9 of substrate 1. In this embodiment, a sprayer 70, having a reservoir 74 with pressurized adhesive/sealant material 76 and nozzle 72, is disposed substantially adjacent to substrate 1. Material 76 is forced through nozzle 72 forming spray 78 which coats the surface of layer 9 as substrate 1 moves in the direction of arrow 80. Again, the surface of layer 9 is continuously coated with adhesive/sealant layer 21b, except where the spray 78 encounters solution 23 within cavities 17.

It should be noted that the above described methods of applying the adhesive/sealant material are not limited to applications involving the joining of a chip and substrate, or multiple substrates. That is, other applications requiring a continuous layer of material are also contemplated by the present invention, such as forming a plating mask, etch mask, or the like.

Figure 8:
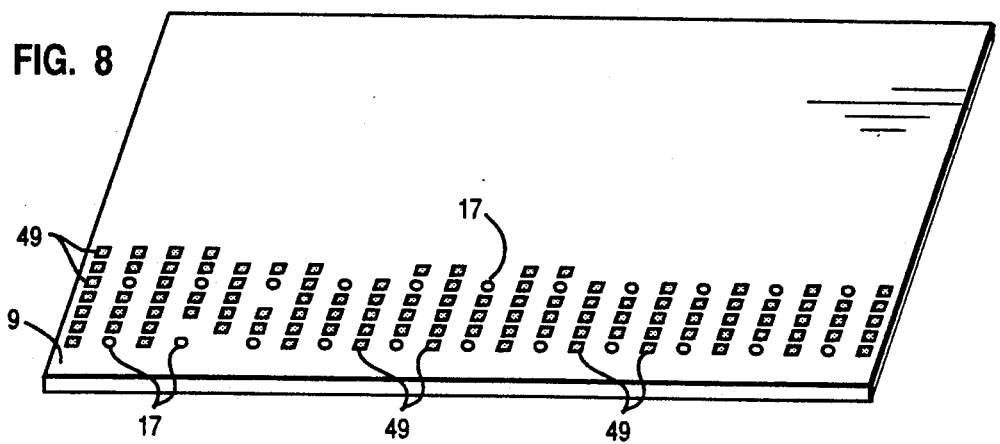
FIG. 8 is a perspective view of a substrate wherein a second preferred embodiment is being used to apply the sealing material.
Figure 9:
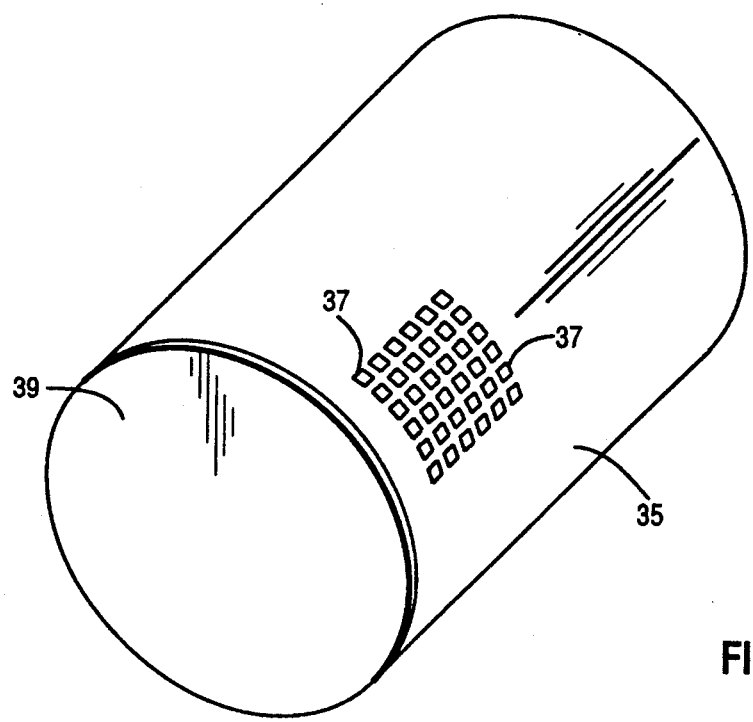
FIG. 9 is a perspective view of a roller used to apply the sealing material in the second preferred embodiment.

In another preferred embodiment, offset printing techniques are utilized to apply the adhesive to the top of dielectric 9. FIGS. 8-11 will be used to describe this technique as it applies to the present invention. FIG. 9 shows a cylindrical roller 39 with a master template 35 disposed therearound. The template 35 includes a plurality of projections 37 on one side thereof which extend outwardly from roller 39, a portion of projections of 37 are shown in FIG. 9, however it will be understood that the entire surface of master 35 may be covered by projections 37. Master 35 is fabricated from a resilient material such that it can be disposed around the outside surface of roller 39.

Figure 10:
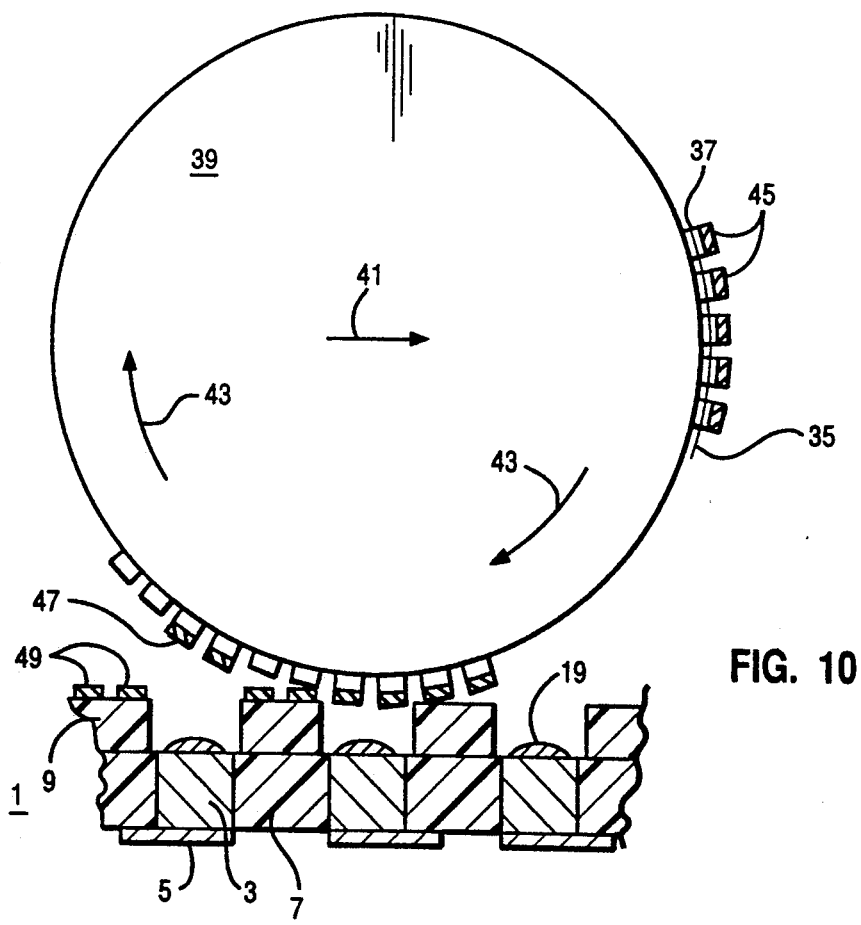
FIG. 10 is a side view of the roller of the second preferred embodiment.

Referring to FIG. 10, roller 39 is shown moving in the direction of arrow 41, resulting in its surface, and the master 35 with projections 37, moving in a direction 43 with respect to dielectric 9. A small amount of thermoplastic/thermoset material 45 has been disposed on the outer surface of projections 37 by, for example, moving roller 39 over a flat surface having a quantity of material placed thereon. It can be seen that as roller 39 moves across the top of dielectric 9, in a direction from left to right as shown in FIG. 10, the adhesive/sealant material 45 on projections 37 will be placed on the top of dielectric 9 at each point where projections 37 encounter dielectric material 9. It can be seen that thermoplastic material 45 will not contact dielectric 9 when projections 37 are adjacent a cavity 17, thus the material will remain adhered to the projections 37, as shown by reference numeral 47. In this manner, a plurality of discrete quantities of adhesive/sealant material 49 will be placed on the top surface of dielectric material 9. It should be noted that no critical alignment is required to apply the adhesive/sealant material using this method. Projections 37 are spaced around the exterior surface of roller 39 such that none of the projections will ever extend into cavities 17 a sufficient distance to deposit the adhesive/sealant material therein.

Figure 11:
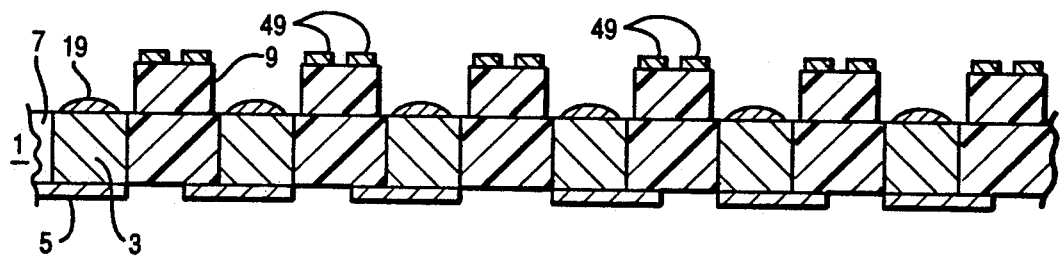
FIG. 11 is a crossection of the substrate after the sealing/adhesive material has been applied using the second preferred embodiment.

FIG. 11 shows a crossectional view of substrate 1 after the quantities of thermoplastic material 49 have been placed on the top surface of dielectric 9. FIG. 8 shows a perspective view of dielectric layer 8 with cavities 17 formed therein, and a plurality of adhesive/sealant dots 49 intermediate cavities 17, disposed along the top surface of dielectric 9.

Figure 7:
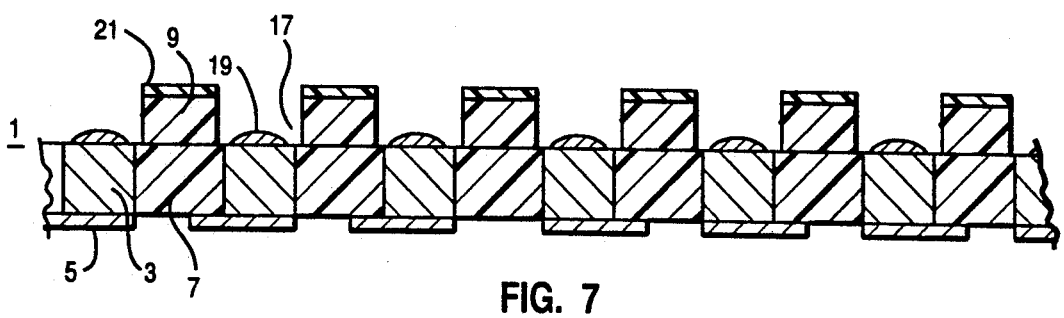
FIG. 7 shows the substrate after the sealing material has been applied using the first preferred embodiment.

By using the first preferred embodiment, a substrate with a continuous thermoplastic layer 21, as shown in FIG. 7, is fabricated. Whereas, using the second preferred embodiment, a substrate with thermoplastic dots 49 on the surface of dielectric 9 are provided.

FIG. 12 shows the substrate of FIG. 7 and an integrated circuit device or chip 50 proximate to substrate 1 and with the C4 solder balls substantially aligned with cavities 17. It should be noted that the substrate shows continuous layer 21 on the surface of dielectric 9, however it is contemplated that layers 21a, 21b or the thermoplastic dots 49 of the second preferred embodiment could be substituted therefore. Chip 50 includes C4 solder balls 52 and 54 disposed substantially adjacent to cavity 17. As previously noted, the dimensions d1 and d are critical to the present invention. It will be understood that C4 solder balls 52 and 54 are not always configured identically. Due to limitations in the manufacturing process that places the C4 solder balls onto a chip, the exact dimension of solder balls vary by as much as $+/-0.3$ mils. A great deal of statistical data regarding solder ball dimensions has been generated and the variance between the diameters of solder balls has been used to determine a mean solder ball dimension. In order to provide accurate testing of chips 50 after placing them on a substrate 1, it is necessary that each C4 solder be in electrical contact with joining metallurgy 19.

Therefore, it can be seen that if dimension d is too large, then as chip 50 is disposed on the substrate 1, the C4 solder balls, e.g. 52. 54 of FIG. 12, may not contact the bottom of cavity 17 and provide good electrical connections with metallurgy 19. If the dimension d is too small, then solder balls 52, 54 of FIG. 12, may not fit into cavity 17 and the solder ball will be overcrushed and the underside of chip 50 will not contact the top surface of layer 9. Further, if the dimension d1 is too large the solder balls may not be properly aligned with the joining metallurgy 19, and the material of layer 9 between adjacent cavities 17 may not be adequate to support the downward pressure of chip 50 as it is placed on substrate 1. If d1 is too small the C4 solder balls 52. 54 may not fit into cavities 17 resulting in the overcrushing of the solder balls, the non-contact of the underside of chip 50 with layer 9 and lack of electrical connection between the solder balls and joining metallurgy 19. Thus, the dimensions d and d1 of cavities 17 must be accurately determined and formed in substrate 1 based upon the statistical analysis of the data corresponding to C4 solder ball dimensions. The thickness of dielectric 9 (d) and the diameter of cavity 17 (d1) must be such that the largest of the C4 solder balls can be inserted into a cavity 17 without excessive force, and the smallest of the C4 will contact joining metallurgy 19 when placed in cavity 17. It can be seen that the methods of applying dielectric 9 as discussed above with reference to FIG. 2 are extremely critical since this thickness will have a great effect on whether the C4 solder balls contact the joining metallurgy 19. Similarly, the dimensions of the artwork used to form the diameter of cavities 17 in FIG. 3 will directly affect the dimension d1. Dimension d1 must be controlled such that the largest of the solder balls will be capable of being inserted into cavity 17, with minimal force required to be exerted on chip 50.

Chip 50 is then pressed into contact with the substrate such that the under side of chip 50 contacts the adhesive/sealant layer 21 and is substantially adjacent to the top layer of dielectric 9. It should be noted that the if the dots 49, of the second preferred embodiment, are utilized, the pressure exerted thereon by chip 50 will cause dots 49 to spread into a continuous layer of material, thereby having the same result as if originally applied in a continuous layer of material as described with reference to FIGS. 5-7, 14 and 15.

FIG. 13 illustrates the chip/substrate module of the present invention. Further, it can be seen from FIG. 13, that C4 solder balls 52 and 54 are deformed to a minor extent such that electrical contact with joining metallurgy 19 is ensured.

Thermoplastic layer 21 serves more than one purpose. First, the material acts as an adhesive such that the disposition of chip 50 with respect to the substrate is maintained throughout testing of the chip, as well as the life of the electronic component, of which chip 50 is a part. This adhesive function, will also aid in the reduction of strain on chip 50 and substrate 1 due to differences in their coefficients of thermal expansions. It is well known that when heated, chips and substrates do not necessarily expand at the same rate, thus resulting in strain exerted on the interconnections therebetween. The adhesive layer 21 will provide bonding between chip 50 and the substrate such that the strain due to the differences in the thermal coefficients of expansion will be minimized. Additionally, the thermoplastic material functions as a sealant thereby hermetically sealing the C4 solder ball area on the underside of the chip 50 from exposure to external contaminants.

Dielectric layer 9 essentially forms a positive stop which allows a great deal more pressure to be exerted on chip 50 than possible when chips are attached directly to the top surface of a substrate, with space between the underside of the chip and the top surface of the substrate. A thickness of about 3 mils for dielectric layer 9 (dimension d) is contemplated, such that a solder balls 52, 54 averaging 6 mils can be compressed a distance of 2 mils until chip 50 contacts dielectric 9 acting as a positive stop. In this manner, proper seating of solder balls 52, 54 within cavities 17 and onto joining metallurgy 19 will occur, and electrical contact therebetween can be ensured. It will be understood by those skilled in the art that the positive stop aspect of the present invention will enhance the placement and seating of any electronic component having electrical interconnections configured as projections similar to C4 solder balls.

Once chip 50 is seated onto the substrate 1, testing of the chip can then occur. If it is determined that chip 50 is faulty, it is a simple matter to remove the chip from the substrate and replace the chip with another. In order to facilitate this reworking feature the glass transition temperature of the thermoplastic material 21 must be lower than the particular C4 solder reflow temperature. In this manner, when a faulty chip is detected, the temperature can be elevated to a point such that the adhesive layer 21 will allow removal of chip 50. However, this temperature will be less then the temperature required to reflow the C4 solder balls. Thus, it is possible to provide accurate testing of the chips since good electrical contact is ensured and replace any faulty chips without reflowing the solder balls. Upon successful completion of testing the temperature is then elevated to the point where the solder reflows, thereby joining with the metallurgy 19.

Figure 16:
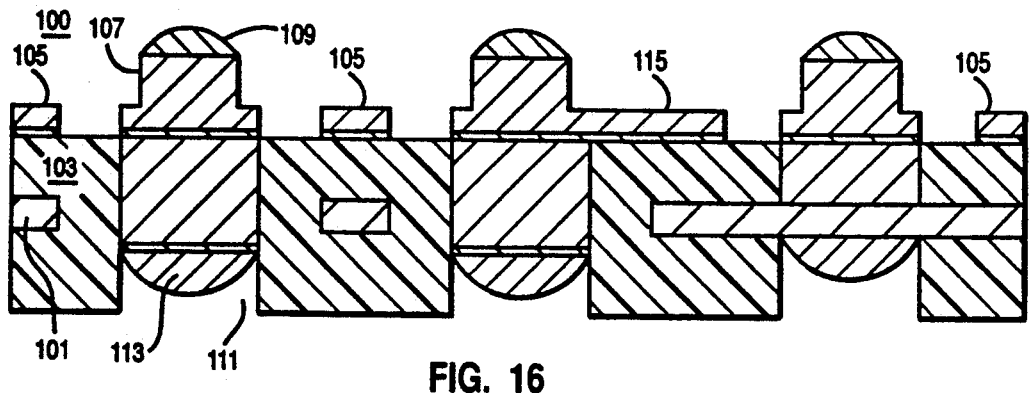
FIG. 16 is a single layer substrate having projections and cavities for interconnection points.

Further, the present invention provides a method of fabricating multilayer modules including plural bonded substrate layers. FIG. 16 illustrates a single layer (1S1P) substrate, generally denoted by reference numeral 100, having a reference plane, or groundplane 101, dielectric layer 103, signal lines 105 and interconnection wiring 115. Substrate 100 also includes plural projections, or bumps 107 with associated joining metallurgy 109 and cavities 111 with associated joining metallurgy 113. This substrate can be fabricated by methods described in co-pending U.S. patent applications "Multi-Level Circuit Structure and Method for Construction Thereof," filed Dec. 29, 1989, Ser. No. 07/549,087, hereby incorporated by reference and assigned to the assignee of the present invention, and "High Density Substrate Design and Manufacturing Process," filed concurrently herewith, also hereby incorporated by reference and assigned to the assignee of the present invention.

Figure 17:
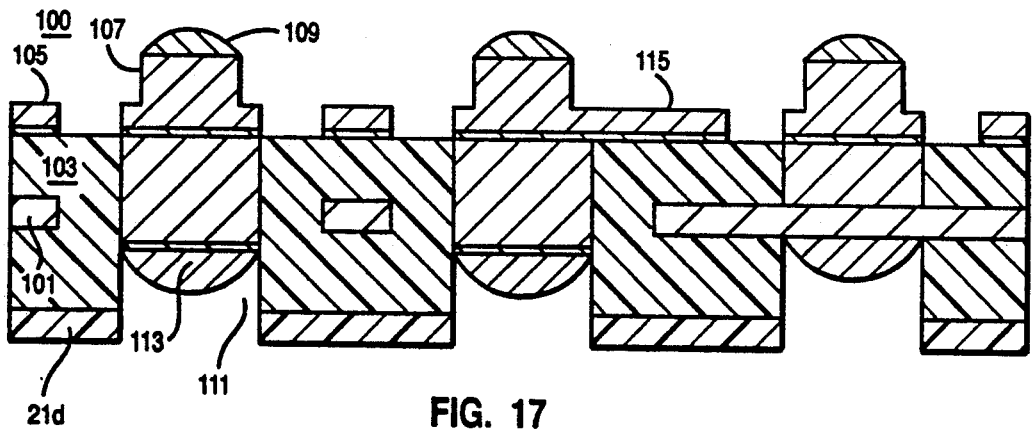
FIG. 17 is the single layer substrate of FIG. 16 have adhesive/sealant material applied to the cavity side thereof.

FIG. 17 shows the substrate 100 of FIG. 16 subsequent to the application of an adhesive/sealant layer 21d being applied to the cavity side surface of the substrate. As previously noted, a thermoset material is preferably used for layer to layer bonding applications. Additionally, the application of thermoset layer 21d can be accomplished by any of the methods previously described with reference to FIGS. 5-10, 14 and 15.

Figure 18:
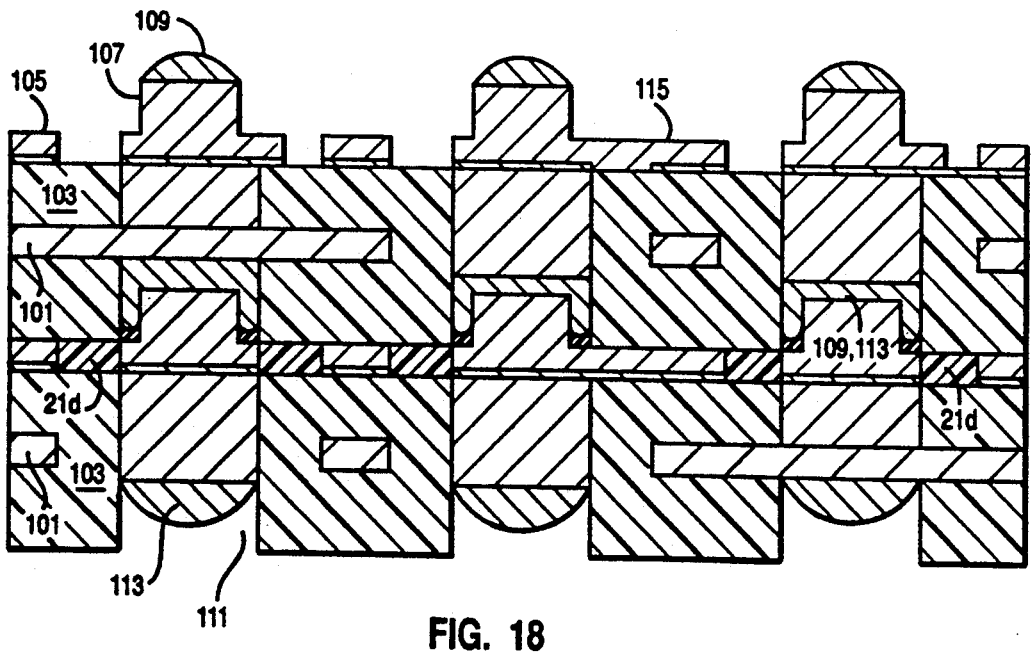
FIG. 18 is another embodiment of the present invention which contemplates layer to layer bonding of substrates.

FIG. 18 represents a two layer module (2S2P) wherein two substrates 100 have been joined together by the application of pressure therebetween, using the techniques of the present invention. It can be seen that joining metallurgy 109, 113, corresponding to coincident projection 107 and cavity 111, respectively, has been reflowed thereby effecting electrical connection between the two substrates 100. Further, adhesive/sealant layer 21d is shown intermediate the cavity side of one substrate and the projection side of the other substrate.

Thus, the present invention provides a method of fabricating and forming an integrated circuit module capable of being used in electronic components, such as computers or the like. It should be noted that chip 50 may include memory chips, microprocessor chips or any other electronic component utilizing C4 solder ball technology. The present invention also provides a process of selectively applying a continuous layer of material onto a surface having a plurality of cavities, depressions, holes, vias, or the like therein. Additionally, the present invention provides a method of fabricating multilayer substrate modules having superior bonding and sealing characteristics between the substrate layers.

Although certain preferred embodiments have been shown and described, it should be noted that many changes and modifications may be made therein without departing from the scope of the appended claims.

What is claimed is:

1. An integrated circuit carrier assembly, comprising:
   a dielectric substrate with a first surface having a plurality of cavities formed therein with a depth less than a thickness of said substrate;
   at least one integrated circuit device including a first surface having a plurality of electrical interconnection projections, aligned with said cavities, said projections being received by said cavities such that the first surface of said integrated circuit device is in contact with the first surface of said substrate; and
   joining material disposed on said first surface of said substrate intermediate said cavities and contacting only said first surface of said substrate and said first surface of said integrated circuit device.

2. An assembly according to claim 1 wherein said projections are configured as solder balls.

3. An assembly according to claim 2 wherein said depth of said cavities, relative to the extension of said solder balls from said first surface of said integrated circuit device, is such that deformation of said solder balls will occur when the first surface of said integrated circuit device is in contact with the first surface of said substrate.

4. An assembly according to claim 3 wherein said cavities have a diameter, relative to a diameter of said solder balls, corresponding to a mean diameter dimension for said solder balls such that all of said solder balls can be received by said cavities.

5. An assembly according to claim 4 wherein said substrate includes plural electrical connection points coincident said cavities and in communication therewith.

6. An assembly according to claim 5 wherein said depth and diameter of said cavities provide that said solder balls and said electrical connection points will make electrically conductive contact.

7. An assembly according to claim 6 wherein said cavities and said first substrate surface form a shoulder capable of withstanding any placement forces required to deform said solder balls.

8. An assembly according to claim 7 wherein said joining material is one of a thermoplastic material and a thermoset material.

9. A method of fabricating an integrated circuit carrier assembly, comprising the steps of:
   forming a dielectric substrate having a first surface with a plurality of cavities therein with a depth less than a thickness of said substrate;
   placing joining material on said first surface of said substrate intermediate said cavities; and
   disposing at least one integrated circuit device including a first surface having a plurality of electrical interconnection projections onto said substrate such that said projections are received by said cavities, and the first surface of said integrated circuit device contacts the first surface of said substrate wherein said joining material contacts only said first surface of said substrate and said first surface of said integrated circuit device.

10. A method according to claim 9 wherein said projections are configured as solder balls.

11. A method according to claim 10 wherein said step of forming a substrate comprises the step of forming said cavity depth, relative to the extension of said solder balls from said first surface of said integrated circuit device, such that deformation of said solder balls will occur when the first surface of said integrated circuit device is in contact with the first surface of said substrate.

12. A method according to claim 11 wherein said step of forming a substrate comprises the step of forming said cavities to have a diameter, relative to a diameter of said solder balls, corresponding to a mean diameter dimension for said solder balls such that all of said solder balls can be received by said cavities.

13. A method according to claim 12 wherein said step of forming a substrate comprises the step of providing plural electrical connection points coincident said cavities and in communication therewith.

14. A method according to claim 13 wherein said step of disposing comprises the step of placing joining material intermediate said first surface of said substrate and said first surface of said integrated circuit device.

15. A method according to claim 14 wherein said step of forming a substrate comprises the step of forming a shoulder between said first surface of said substrate and said cavities capable of withstanding any placement forces required to deform said solder balls.

16. A method according to claim 15 wherein said step of disposing comprises the step of providing electrical contact between said solder balls and said electrical connection points, based upon said depth and diameter of said cavities.

17. A method according to claim 16 wherein said step of placing joining material comprises the step of selectively placing said joining material only on the first surface of said substrate.

18. A method according to claim 17 wherein said joining material is one of a thermoplastic material and a thermoset material.

* * * * *